(12) United States Patent  
Chien

(10) Patent No.: US 7,345,356 B2
(45) Date of Patent: Mar. 18, 2008

(54) OPTICAL PACKAGE WITH DOUBLE FORMED LEADFRAME

(75) Inventor: Chih-Cheng Chien, Sindian (TW)

(73) Assignee: Capella Microsystems Corp., Tortola (VG)

( * ) Notice: Subject to any disclaimer, the term of this patent is extended or adjusted under 35 U.S.C. 154(b) by 115 days.

(21) Appl. No.: 11/207,752

(22) Filed: Aug. 22, 2005

(65) Prior Publication Data

US 2007/0007632 A1    Jan. 11, 2007

Related U.S. Application Data

(60) Provisional application No. 60/696,822, filed on Jul. 7, 2005.

(51) Int. Cl.
*H01L 23/495* (2006.01)
(52) U.S. Cl. .................. 257/666; 257/669; 257/674; 257/676; 257/E23.031; 257/E23.04; 257/E23.042; 257/E23.047; 257/E23.049
(58) Field of Classification Search ........ 257/666–667, 257/E23.004–E23.009, E23.031–E23.059; 438/112, 123, FOR. 366, FOR. 367, FOR. 377, 438/FOR. 380
See application file for complete search history.

(56) References Cited

U.S. PATENT DOCUMENTS 5,115,298 A * 5/1992 Loh ........................... 257/691
5,973,407 A * 10/1999 Tzu et al. ................... 257/796
2004/0217450 A1* 11/2004 Li et al. ..................... 257/666
2006/0261453 A1* 11/2006 Lee at al. ................... 257/676

* cited by examiner

*Primary Examiner*—Jasmine Clark
(74) *Attorney, Agent, or Firm*—Rosenberg, Klein & Lee

(57) ABSTRACT

Packages for an optical integrated circuit die and a method for making such packages are disclosed. The package includes a die, a die pad, a plurality of lead fingers, and an encapsulating dielectric material. The downward second pad surface of the die pad bearing an integrated circuit is encapsulated by a bottom encapsulating dielectric material. The top encapsulating dielectric material provides the function for protecting the leadframe from severe environment. The top encapsulating dielectric material can be neglected if there is no threat on the integrated circuit die and the leadframe. Multiple of lead fingers are mounted on the printed circuit board. A portion of the printed circuit board is removed in order to provide an optical path for the light beam transmitted from a light source through the transparent bottom encapsulating dielectric material into the integrated circuit die. The method of making a package includes forming a leadframe including a die pad and a plurality of lead fingers. A die is attached on the downward second surface of the die pad. There are bonding wires electrically coupling the die and the lead fingers. Transparent dielectric encapsulating material covers the die, the die pad and a portion of the lead fingers. Finally, the package is mounted on a printed circuit board with flatly bended tip portion of the lead fingers.

7 Claims, 6 Drawing Sheets

OPTICAL PACKAGE WITH DOUBLE FORMED LEADFRAME

REFERENCE TO RELATED APPLICATION

This Application is based on U.S. Provisional Patent Application Ser. No. 60/696,822 filed on 7 Jul. 2005.

FIELD OF THE INVENTION

The present invention relates to an IC package and a method for making the same. More particularly, the invention relates to leadframe structures and methods for using in optical systems.

BACKGROUND OF THE INVENTION

The package is to toward a cost oriented business of manufacturing. Generally, an integrated circuit die is enclosed in plastic packages to be resistant to hostile environments and to provide electrical connections between the semiconductor die and printed circuit boards. A package usually includes a metal leadframe, a semiconductor die, bonding material to attach the semiconductor die to the leadframe, bonding wires connecting pads on the semiconductor die to lead fingers of the leadframe, and a plastic encapsulant material sheltering all the components mentioned above but a portion of lead fingers for electrically connecting to external pads on printed circuit boards.

A portion of lead fingers of a leadframe is internal to the package with encapsulant surrounding the portion of lead fingers and the die pad of a leadframe, wherein the die pad of a leadframe is the central supporting structure of a leadframe. Another portion of lead fingers of a leadframe is external to the package without encapsulant material surrounding and electrically connected to pads on printed circuit boards. After the die is coupled to a leadframe with wirebonds, the die, die pad of leadframe, and a portion of lead fingers are encapsulated in plastic by flowing plastic over them at high temperature and pressure. Before mounting the package on the printed circuit boards, a mold is necessary for bending the extended lead fingers at specific angle with small tolerance of deviation in mass production. Generally, it is costly to design and construct a mold and it is hard to modify the specification of a mold.

While used in an optical system, a semiconductor die is usually required to receive light and manipulate the information from the light according to the properties of light. A clean mode package (CMP) is employed especially for designs in optical systems. The clean mode package provides a transparent encapsulant material covering a semiconductor die and a leadframe despite a portion of a lead connected to pads on printed circuit boards. A light source passing through the encapsulant material is further transferred into electrical signals by the semiconductor die, i.e. photo sensors.

A problem with conventional CMP is that only the top side of a die pad of a leadframe is utilized. In an optical system like pick-up head of a compact disk (CD) system or a digital video disc (DVD) system, the requirement about reducing the size of the system construction is in great demand, in particular, in mobile devices. A prior art in exploiting the area utilization of printed circuit boards to save space shown that a daughter printed circuit board is obligated in an optical system. Additional connections between mother printed circuit board and daughter printed circuit board are necessary. The connections can use a socket on the mother board for the daughter printed circuit board or solderable materials between the mother board and daughter board. The oxidation of the metal material of socket and the solderable materials causes deterioration of the reliability. Although the other side of the mother printed circuit board is employed, cost for a system with additional daughter printed circuit board increases and reliability for a system connecting a complex component decreases.

SUMMARY OF THE INVENTION

It is accordingly an object of the present invention to provide a method and a package for semiconductor chips, in particular a clean mode package (CMP) for an optical system, which overcomes the hereinbefore-mentioned disadvantages of the known prior art with additional cost and low reliability. Without adding supplementary components and modifying the specification of a mold which bends fingers of leadframes, the packages of the present invention are easier and less expensive to make than conventional plastic packages, and are more reliable and efficiently-sized than conventional packages.

The term "leadframe" should be understood in the sense of the invention to mean an individual carrier or substrate unit intended to receive a semiconductor chip. In mass production, a plurality of leadframes is combined with one another into a ribbon or strip. Typically, only the top surface of the die pad of a metal leadframe comprising a plurality of lead prongs and a die pad is utilized.

In accordance to the preferred embodiment of the present invention, a method employing the bottom surface of the die pad is disclosed. The term "double formed leadframe" means a leadframe not only utilizing the top surface of the die pad but also employing the bottom surface of the die pad. A metal leadframe includes a substantially planar die pad within and connected to the leadframe. A plurality of finger-like tabs extends from the leadframe toward the die pad without contacting the die pad. The number and location of the tabs around the frame may vary. Silver colloid is applied on the bottom surface of the die pad of the leadframe and a portion of the lead fingers. At least one semiconductor die is placed on the die pad of the leadframe. The surface of the substrate of the semiconductor die is attached on the adhesive silver colloid layer applied on the bottom surface of the die pad of the leadframe. Generally, there are multiple pads on the top surface of the semiconductor die. Those pads are formed by creating multiple rectangular window areas on the top isolation layer of the semiconductor die so that the top metal layer of the semiconductor die can be reached by the bonding wires. A plurality of bond wires electrically provides connections between the pads on the semiconductor die and the portion of lead fingers deposited with a layer of silver colloid. Silver colloid material increases the reliability for the binding between bond wires and lead fingers of the leadframe. Also, silver colloid material provides an adhesive layer and a grounding layer for the semiconductor die. The adhesive layer settles the semiconductor die on the die pad of the leadframe and the grounding layer helps the semiconductor die with good electrical characteristics by providing a grounding path for noise in the substrate.

The leadframe provides the main electrical structure for a semiconductor die. Furthermore, an encapsulating dielectric material, covering the die, the bond wires, and the die pad and a potion of lead fingers of the leadframe, is applied. Typically, both surfaces of the die pad of the leadframe are encapsulated by the viscous encapsulant material but, in exceptional cases, only one surface of the leadframe is encapsulated if the influence of the hostile environment on the other surface can be ignored.

According to an aspect of the present invention, the package has lead fingers having specific turns for mounting and soldering on the printed circuit board. In mass production, the angle tolerance of the turns of the lead fingers is restricted in a small range. A precise mold is used to bend the lead fingers at specific angles. Since the mold is made mechanically with extremely accuracy, the cost having a mold is very expensive, i.e. more than hundreds of thousand dollars.

According to another aspect of the present invention, there is provided an clean mode package including a frame, a die pad connected to the frame having a first planar pad surface and a second planar pad surface, a plurality of tabs connected to the frame and extending toward the die pad in spaced relation thereto, and a plurality of lead fingers extending outward for mounting on printed circuit boards. An integrated circuit die is placed on the second planar pad surface of the die pad. Bond wires electrically connect the integrated circuit die to inward tips of lead fingers of the frame. An encapsulant material covers the integrated circuit die, the second planar pad surface of the die pad, and a portion of the lead fingers. The first planar pad surface of the die pad could be or not be encapsulated by the encapsulant material depending on the resistant of the first planar pad surface to hostile environments.

According to a further aspect of the present invention, there is provided an optical system including a frame, a die pad connected to the frame having a first planar pad surface and a second planar pad surface, a plurality of tabs connected to the frame and extending toward the die pad in spaced relation thereto, and a plurality of lead fingers extending outward for mounting on printed circuit boards. An integrated circuit die is placed on the second planar pad surface of the die pad. Bond wires electrically connect the integrated circuit die to inward tips of lead fingers of the frame. An encapsulant material covers the integrated circuit die, the second planar pad surface of the die pad, and a portion of the lead fingers. The lead fingers are mounted on a printed circuit board with a hole positioned perpendicular to the integrated circuit die. A light source emits light toward the integrated circuit die via the hole of the printed circuit board. A transformation of light signals into electrical signals occurs in the integrated circuit die. The integrated circuit die transmits electrical signals through bond wires and lead fingers to the other component of the optical system.

DETAILED DESCRIPTION OF THE PREFERRED EMBODIMENTS

Figure 1:
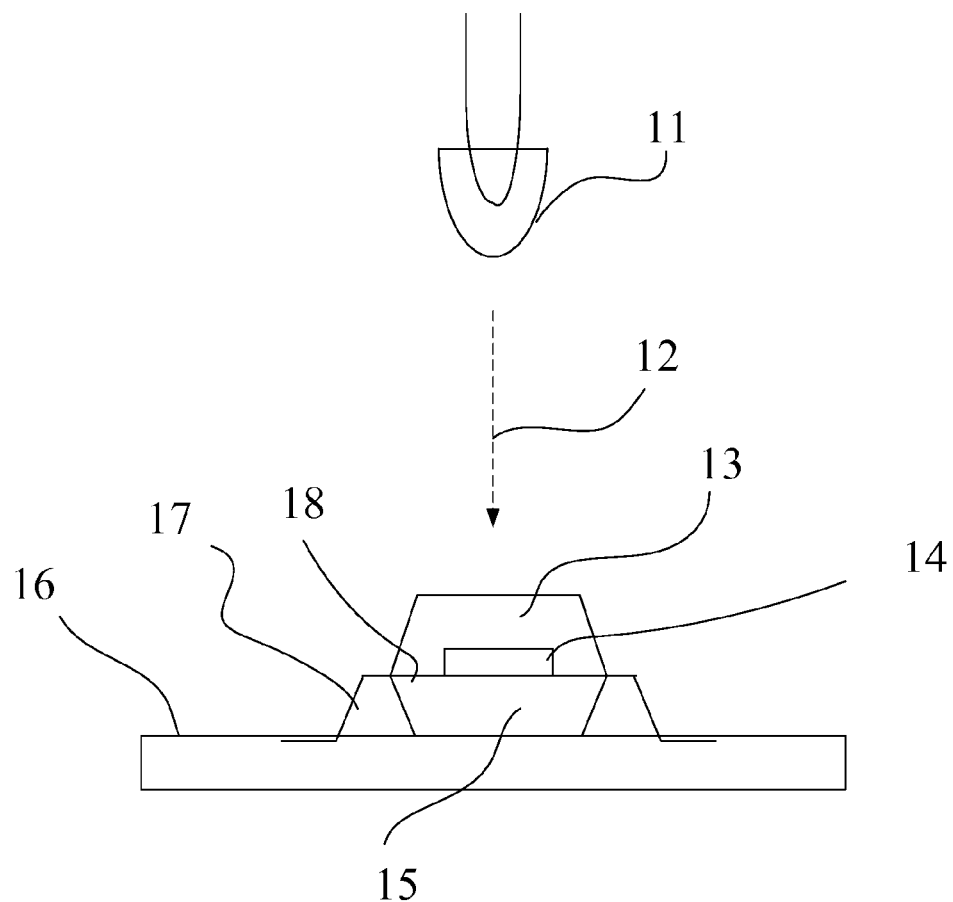
FIG. 1 is a cross-sectional diagram of an optical system in prior art.

FIG. 1 is a cross-sectional diagram of an optical system in prior art. A leadframe including a substantially planar die pad 18 within and connected to the leadframe has multiple lead fingers 17 at specific bending angles, wherein a portion of the lead fingers is mounted on a top surface of a printed circuit board 16. There is an integrated circuit die 14 attached on the upward first pad surface of the leadframe. A top encapsulating dielectric material 13 is applied onto the upward first pad surface and a bottom encapsulating dielectric material 15 onto a downward second pad surface. The top encapsulating dielectric material 13 also embraces the integrated circuit die 14 and a portion of the multiple lead fingers 17. Generally, the encapsulating dielectric material 13 is transparent for a package embodied an optical integrated circuit die 14, wherein the optical integrated circuit die 14 receives the optical information 12 from environment outside, manipulates the variation of the optical information 12, and transmits electrical signals via the lead fingers 17 to other components on the printed circuit board 16. A light beam 12 is transmitted into the top encapsulating dielectric material 13 from a light source 11. In this prior art, the package consumes much space between the light source 11 and the integrated circuit die 14. For mobile apparatus, this causes a problem on shrinking the size of an electronic apparatus and limits the concepts of industry design.

Figure 2:
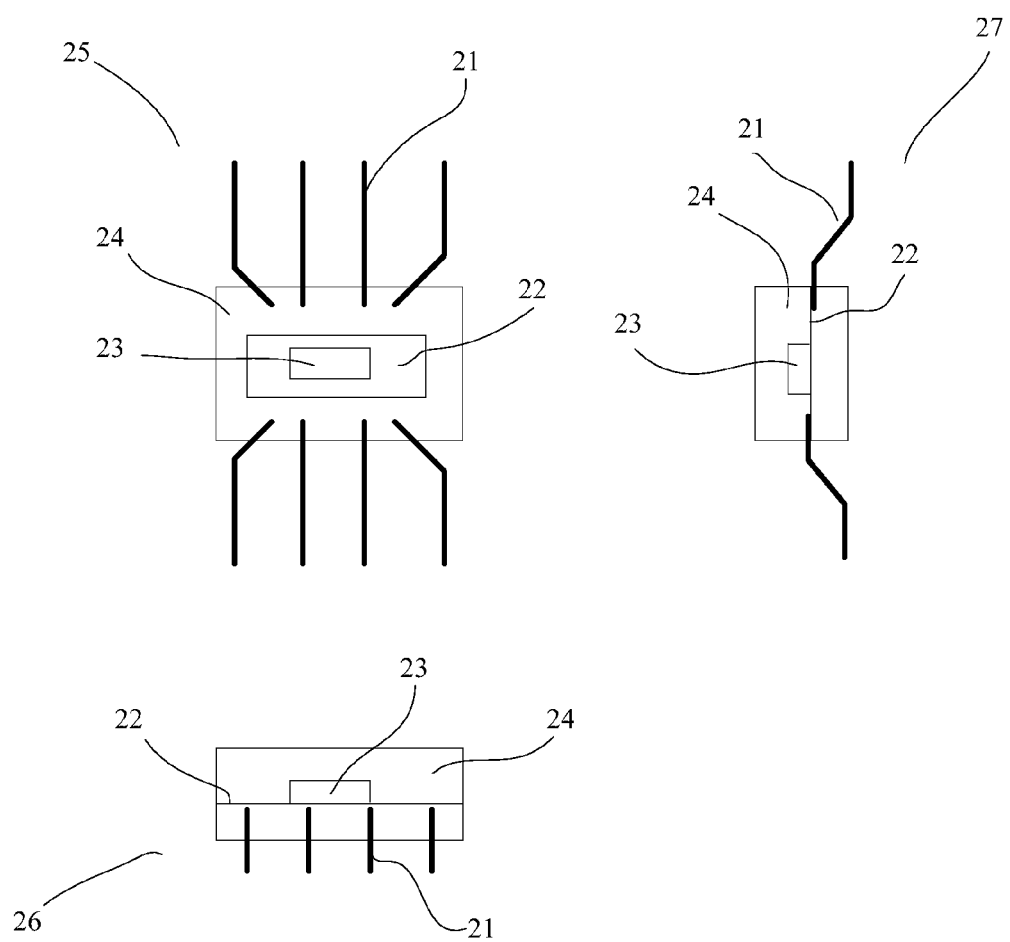
FIG. 2 illustrates a general package with a top plan, side elevational, and rear elevational views.

FIG. 2 illustrates a general package with a top plan, side elevational, and rear elevational views. The top plan view 25 shows the structure of a package in prior art. A planar die pad 22 encapsulated by encapsulating dielectric material 24 holds an integrated circuit die 23. A portion of multiple lead fingers 21 is also covered by the encapsulating dielectric material 24. Another portion of multiple lead fingers 21 extends outward and provides a path transporting electrical signals between the integrated circuit die 23 and other components on the printed circuit board. A leadframe is composed of the planar die pad 22, and multiple lead fingers 21. In a completed package, there are usually reentrant portions and asperities of the side surfaces of the die pad 22 as encapsulant fasteners or lead locks. The side elevational view 26 shows the structure of a package in prior art from another perspective view of point. The integrated circuit die 23 is positioned on the upward first pad surface of the die pad 22. The encapsulating dielectric material 24 embodies the integrated circuit die 23, planar die pad 22 of the leadframe, and a portion of lead fingers 21. A portion of lead fingers 21 are bended downward in order to be mounted on the printed circuit board. From the rear elevational view 27, the integrated circuit die 23 is positioned on the upward first pad surface of the die pad 22. The encapsulating dielectric material 24 embodies the integrated circuit die 23, planar die pad 22 of the leadframe, and a portion of lead fingers 21. A portion of lead fingers 21 extended outside is bended at specific angles by a mechanical mold. The end portion of the lead fingers 21 is curved horizontally so as to be mounted on printed circuit boards easily and to improve the reliability of whole system.

Figure 3:
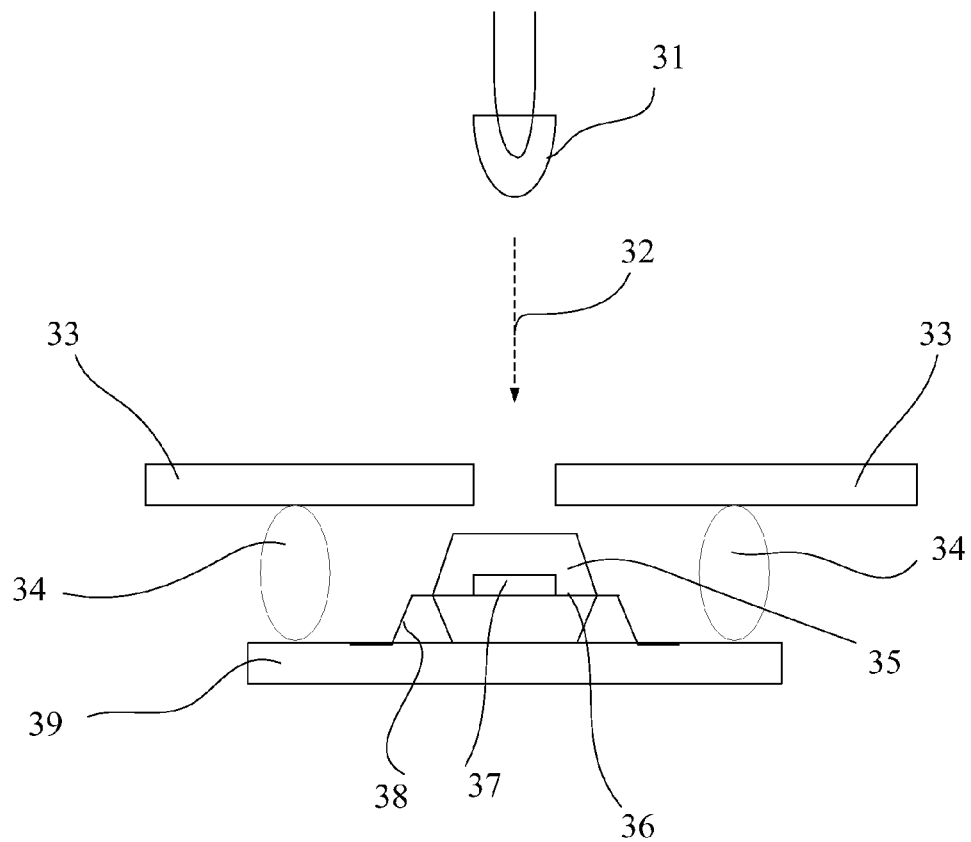
FIG. 3 is a cross-sectional diagram of an optical system in prior art with a daughter printed circuit board.

FIG. 3 is a cross-sectional diagram of an optical system in prior art with a daughter printed circuit board. Typically, an optical system with a daughter printed circuit board 39 is applied while the space between the light source 31 and the mother printed circuit board 33 is critical while a small and mobile apparatus is required. A die pad 36 of a leadframe holding an integrated circuit die 37, and a portion of lead fingers 38 are encapsulated by the encapsulating dielectric material 35. Another portion of lead fingers 38 is mounted on a daughter printed board 39. There is provided a hole on the mother printed circuit board 33 between the light source 31 and the integrated circuit die 37 along the direction of the light beam 32. The optical information of the light beam 32 is received by the integrated circuit die 37 and further transformed into appropriate electrical signals. Furthermore, the electrical signals are forwarded through the lead fingers 38, metal paths on the daughter printed circuit board 39, and the conductive material 34, i.e. a socket or soldering balls to other components on the mother printed circuit board 33. Although the space between the light source 31 and the mother printed circuit board 33 are reserved, additional cost including the daughter printed circuit board 39 and the conductive material 34 increases. Moreover, there is still a large space occupied by the subsystem comprising the package of the integrated circuit die and the daughter printed circuit board 39 at the second downward surface of the mother printed circuit board 33.

Figure 4:
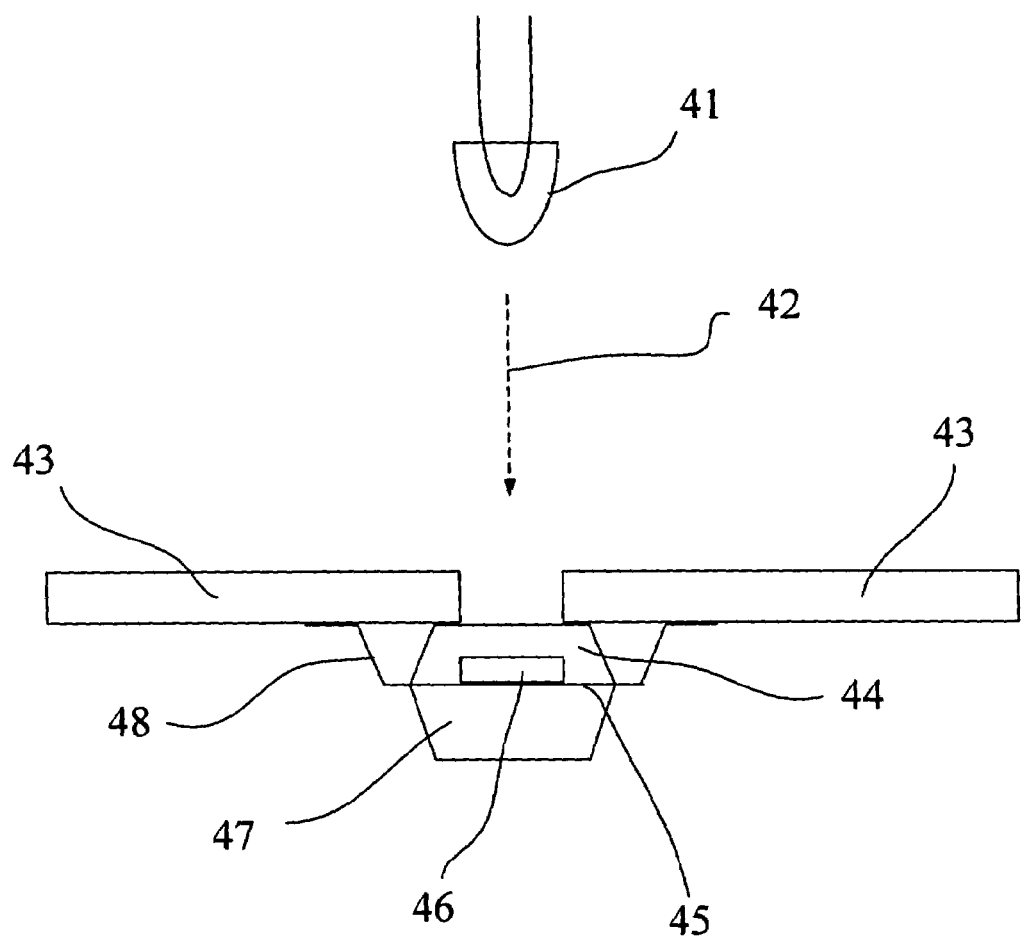
FIG. 4 shows a cross-sectional diagram of an optical system in accordance with an embodiment of the preset invention employing the package with a double formed leadframe.

FIG. 4 shows a cross-sectional diagram of an optical system in accordance with a preferred embodiment of the preset invention employing the package with a double formed leadframe. The downward second pad surface of the die pad 45 bearing an integrated circuit die 46 is encapsulated by a bottom encapsulating dielectric material 44. The top encapsulating dielectric material 47 provides the function for protecting the leadframe from severe environment. The top encapsulating dielectric material 47 can be neglected if there is no threat on the integrated circuit die 46 and the leadframe from the top side. Multiple of lead fingers 48 are mounted on the printed circuit board 43. A portion of the printed circuit board 43 is removed in order to provide an optical path for the light beam 42 transmitting from light source 41 through the transparent bottom encapsulating dielectric material 44 into the integrated circuit die 46.

As noted, the drawings show a particularly preferred embodiment of the invention. However, numerous other variants are possible that are also within the scope of the invention. For instance, the lead fingers 48 need not to be constructed as a fold but can instead to carry the leadframe in the form of horizontal lead fingers. It is also not necessary only one integrated circuit die on the downward second pad surface of the die pad 45. On the contrary, a plurality of integrated circuit dies can be attached on the downward second pad surface of the die pad 45. The number, location and shape of the lead surfaces can vary and they depend on the type of the leadframe, the size and location of the semiconductor chip to be mounted. Fundamentally, all known methods for producing plastic packages are suitable, and all relevant plastics can be used.

Figure 5:
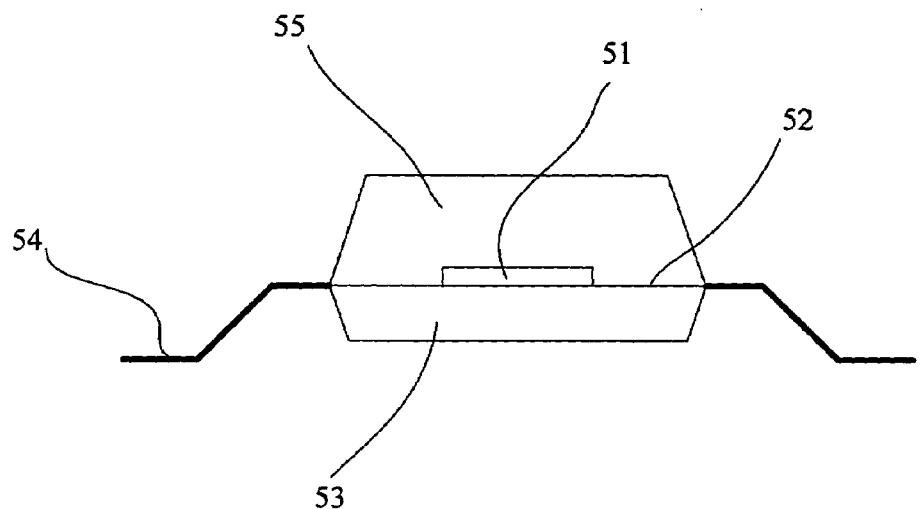
FIG. 5 is a cross-sectional diagram of an integrated circuit (IC) package in prior art.

FIG. 5 is a cross-sectional diagram of an integrated circuit (IC) package in prior art. There is provided a die pad 52 on which an integrated circuit die 51 is attached on the upward first pad surface of the die pad 52. The top encapsulating dielectric material 55 shelters the integrated circuit die 51, the upward first pad surface of the die pad 52 and a portion of the lead fingers 54. The bottom encapsulating dielectric material 53 covers the downward second pad surface of the die pad 52 and a portion of the lead fingers 54. Furthermore, the tips of the lead fingers 54 are bent flatly so as to be mounted on a printed circuit board with high reliability. Generally, the thickness of the top encapsulating dielectric material 55 embodying the integrated circuit die 51 is greater than that of the bottom encapsulating dielectric material 53.

Figure 6:
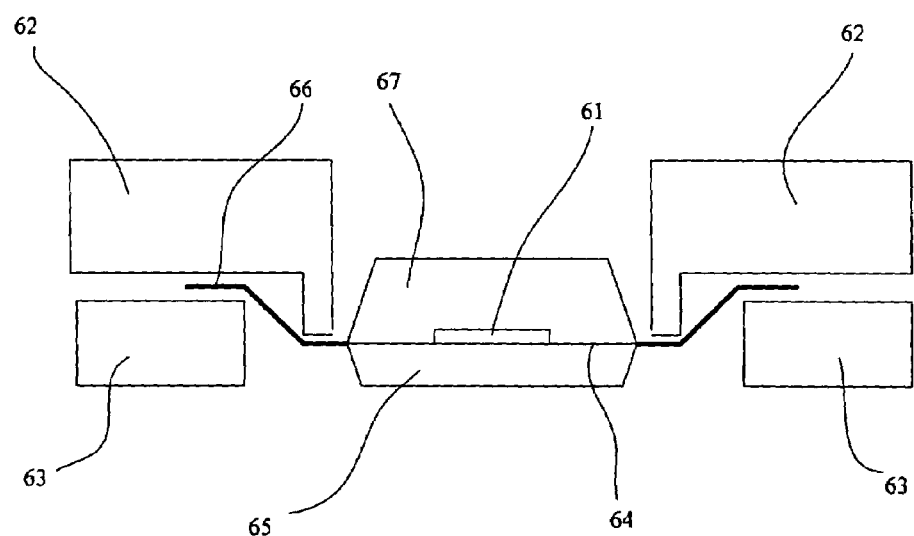
FIG. 6 illustrates an inappropriate method by bending the lead fingers of a leadframe at the opposite direction.

FIG. 6 illustrates an inappropriate method by bending the lead fingers 66 of a leadframe at the opposite direction. The diagram shown in FIG. 6 illustrates an inappropriate method by bending the lead fingers 66 with original mold 62, 63 used for the package in FIG. 5 at the opposite direction. The mold 62, 63 is designed so that the vertical extension of the lead fingers 54 can exceed the thickness of the bottom encapsulating material 53 in order that the tips of lead fingers 54 can be mounted on the printed circuit board. The thickness of the top encapsulating material 67 is often larger than the vertical extension of the lead fingers 66. It is difficult to mount the package in FIG. 6 onto the printed circuit board.

Figure 7:
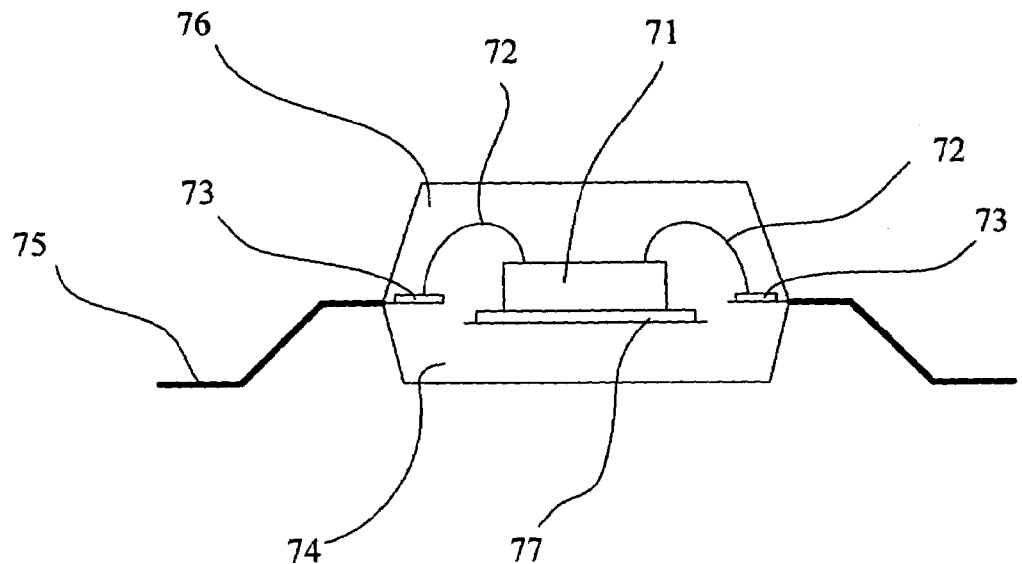
FIG. 7 is a cross-sectional diagram of an integrated circuit (IC) package in prior art with details on the interconnections between the integrated circuit die and the leadframe in prior art.

FIG. 7 is a cross-sectional diagram of an integrated circuit (IC) package in prior art with details on the interconnections between the integrated circuit die and the leadframe in prior art. In a package in prior art, a silver colloid layer 77 is usually applied on the upward first surface of the die pad and a portion of the lead fingers 75. An integrated circuit die 71 is stabilized on the upward first surface of the die pad with the silver colloid layer 77. The silver colloid layer 73 on the lead fingers 75 provides a proper material on which bonding wires 72 can be bonded firmly. A top encapsulating material 76 encapsulating the integrated circuit die 71, bonding wires 72, die pad of the leadframe, and a portion of the lead fingers 75. A bottom encapsulating material 74 covers the downward second surface of the die pad.

Figure 8:
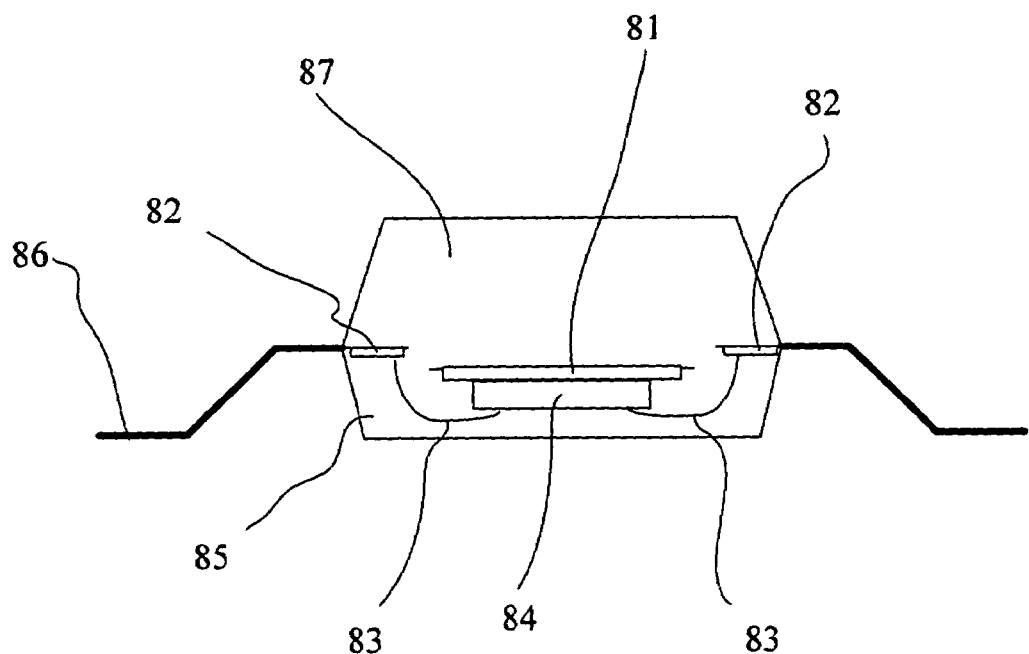
FIG. 8 is a cross-sectional diagram of an integrated circuit (IC) package according to the present invention utilizing the second planar pad surface as a substrate receiving the integrated circuit die.

FIG. 8 is a cross-sectional diagram of an integrated circuit (IC) package according to the present invention utilizing the second planar pad surface as a substrate receiving the integrated circuit die. A silver colloid layer 81 is applied on the downward second surface of the die pad. A silver colloid layer 82 is also applied on a portion of the lead fingers 86. There is provided a polishing step for the integrated circuit die 84 if the thickness of the bottom encapsulating dielectric material 85 is not enough to shelter the components attached on the downward surface of the die pad and the portion of the lead fingers 86 for bonding wires 83. There is still plenty of room on the substrate of the integrated circuit die 84. With the polishing step on the substrate of the integrated circuit die 84, the change on the thickness of the bottom encapsulating dielectric material 85 is not necessary and the reliability of the wire bonding is also improved by reducing the distance between the pads on the integrated circuit die 84 and the portion of the lead fingers 86 deposited with silver colloid layers 82.

What is claimed is:

1. An IC package, comprising:
a leadframe with a die pad having an upward first pad surface, a downward second pad surface and a plurality of lead fingers;
at least one die attached on the second pad surface of the leadframe;
a plurality of bonding wires electrically connecting the die to the lead fingers of the leadframe;
a transparent dielectric material encapsulating the die and a portion of the leadframe; and a silver colloid layer depositing on the downward second pad surface and a portion of the lead fingers.

2. The package according to claim 1, the die including at least one photo sensor.

3. The package according to claim 1, the silver colloid layer on the lead fingers providing an attachable pad for the bonding wires.

4. An IC package, comprising:
a leadframe with a die pad having a upward first pad surface, a downward second pad surface and a plurality of lead fingers;
at least one die attached on the second pad surface of the leadframe;
a plurality of bonding wires electrically connecting the die to the lead fingers of the leadframe; and
a transparent dielectric material encapsulating the die and a portion of the leadframe, the dielectric material including a top encapsulating dielectric material and a bottom encapsulating dielectric material.

5. The package according to claim 4, wherein the bottom encapsulating dielectric material encapsulates the die, die pad of leadframe, and a portion of the lead fingers.

6. An IC package, comprising:
a leadframe with a die pad having a upward first pad surface, a downward second pad surface and a plurality of lead fingers, the lead fingers containing a tip portion beaded flatly for mounting and being electrically connected to a printed circuit board;
at least one die attached on the second pad surface of the leadframe;
a plurality of bonding wires electrically connecting the die to the lead fingers of the leadframe; and
a transparent dielectric material encapsulating the die and a portion of the leadframe, wherein the IC package is mounted on the printed circuit board having a hole for light to pass into the die of the IC package.

7. The package according to claim 6, wherein a light emitting by a light source passes trough the hole of the printed circuit board into the die of the package.

* * * * *